United States Patent [19]
McTeer

[11] Patent Number: 5,838,052
[45] Date of Patent: Nov. 17, 1998

[54] REDUCING REFLECTIVITY ON A SEMICONDUCTOR WAFER BY ANNEALING TITANIUM AND ALUMINUM

[75] Inventor: Allen McTeer, Boise, Id.

[73] Assignee: Micron Technology, Inc., Boise, Id.

[21] Appl. No.: 610,595

[22] Filed: Mar. 7, 1996

[51] Int. Cl.$^6$ ............................................. H01L 31/0232
[52] U.S. Cl. .......................... 257/437; 257/764; 257/771
[58] Field of Search .................................. 257/751, 764, 257/765, 771, 437

[56] References Cited

U.S. PATENT DOCUMENTS

| | | | |
|---|---|---|---|
| 4,783,248 | 11/1988 | Kohlhase et al. | 204/192.17 |
| 5,066,611 | 11/1991 | Yu . | |
| 5,281,850 | 1/1994 | Kanamori | 257/767 |
| 5,427,666 | 6/1995 | Muller et al. | 204/192.17 |
| 5,441,616 | 8/1995 | Nanda et al. | 204/192.23 |

OTHER PUBLICATIONS

W.Y.–C. Lai et al., "The Use of Ti as an Antireflective Coating for the Laser Planarization of Al for VLSI Metallization", *6th Int'l IEEE VLSI Multilevel Interconnect Conference*, Cat. No. 89–TH0259–2, Jun. 12–13, 1989, p. 501.

R. Lui et al., "Study of Pulsed Laser Planarization of Aluminum for VLSI Metallization", *6th Int'l IEEE VLSI Multilevel Interconnect Conference*, Cat No. 89TH0259–2, Jun. 12–13, pp. 329–335.

*Primary Examiner*—Mahshid D. Saadat
*Assistant Examiner*—S. V. Clark
*Attorney, Agent, or Firm*—Mueting, Raasch & Gebhardt, P.A.

[57] ABSTRACT

The present invention provides methods of producing an anti-reflective layer on a semiconductor wafer/device and wafers/devices including that anti-reflective layer. The anti-reflective layer is produced by annealing layers of titanium and aluminum on a wafer/device to provide a roughened surface that significantly reduces reflectivity to improve the accuracy and definition provided by optical lithography processes.

8 Claims, 3 Drawing Sheets

REDUCING REFLECTIVITY ON A SEMICONDUCTOR WAFER BY ANNEALING TITANIUM AND ALUMINUM

FIELD OF THE INVENTION

The present invention relates to methods of reducing reflectance at the surface of a semiconductor wafer. More particularly, the present invention provides a method of producing an anti-reflective layer on a semiconductor by annealing titanium and aluminum.

BACKGROUND OF THE INVENTION

Patterning layers of photoresist using optical lithography to provide desired circuits or other structures on a semiconductor wafer is known. The photoresist material is imaged using a mask having the desired pattern after which a portion of the resist is removed to expose the underlying layer of the semiconductor wafer. Additional processing may then be performed, such as depositing materials in the exposed areas, etc.

To increase speed and performance of integrated circuits, it is desirable to continually decrease the dimensions of structures, such as traces, etc. that are placed in the exposed areas on the wafer. One factor that limits the dimensions in optical lithography is reflection of the light used to expose the photoresist. The reflected list adversely affects the control over dimensions by, for example, exposing photoresist outside of the desired areas which can lead to undercutting. Another undesirable effect of reflections from the underlying surface is the creation of standing waves if the illuminating light is monochromatic. The standing waves can vary the development of the resist material along the edges of the pattern, thereby decreasing the image resolution.

The additional exposed photoresist will result in variations in the desired dimensions of the areas exposed in the photoresist material. As a result, the areas exposed in the photoresist will also vary. Although those variations can be accounted for in the design of the patterns, they do limit the minimum dimensions that can be accurately patterned.

Reflectance problems are particularly troublesome when the layer underneath the photoresist is aluminum. Aluminum is widely used in the manufacture of integrated circuits because of its low melting point, high conductivity and low cost. It is, however, highly reflective which enhances the reflectivity problems discussed above.

One attempt at reducing reflectance of aluminum beneath a layer of photoresist to enhance resolution in optical lithography involves depositing an anti-reflective coating (ARC) on the aluminum, beneath the photoresist, to absorb light reaching the aluminum to prevent it from exposing unwanted areas of photoresist. One example of an anti-reflective coating is amorphous silicon as described in U.S. Pat. No. 5,441,616 to Nanda, et al. Another example is a sputtered layer of TiN as described in U.S. Pat. No. 5,427,666. When using TiN, however, reflectance is typically reduced to about 20% of the incident light and is only that effective over relatively narrow range of wavelengths.

SUMMARY OF THE INVENTION

The present invention provides methods of producing an anti-reflective layer on a semiconductor wafer/device. The anti-reflective layer is produced by annealing layers of titanium and aluminum on a wafer/device to provide a roughened surface that significantly reduces reflectivity to improve the accuracy and definition provided by optical lithography processes.

The annealing can be performed in a nonreactive atmosphere resulting primarily in the formation of $Ti_xAl_{1-x}$. Alternatively, the annealing can be performed in a nitrogen atmosphere where it results in the formation of primarily $Ti_xAl_{1-x}$ and $Ti_xAl_{1-x}N_y$ where x and y can be the same or different.

One advantage of the annealing processes and products according to the present invention is that reflectivity can be significantly lowered over a useful range of wavelengths, preferably from about 100 to about 450 nm.

These and other various features and advantages of the invention are more fully shown and described in the drawings and detailed description of this invention, where like reference numerals are used to represent similar parts. It is to be understood, however, that the description and drawings are for the purposes of illustration only and should not be read in a manner that would unduly limit the scope of this invention.

DETAILED DESCRIPTION OF THE INVENTION

The present invention is directed to methods of providing an anti-reflective coating by annealing layers of titanium and aluminum deposited on the surface of a semiconductor wafer. The anti-reflective coating improves the resolution of images patterned into a photoresist located on the semiconductor wafer by reducing the amount of light reflected off of the surfaces beneath the photoresist.

The anti-reflective layer formed by annealing according to the present invention is useful in the production of, for example, semiconductor devices such as memory chips and processors.

The reflectance is reduced due to scattering by the increased surface roughness formed upon annealing of the titanium and aluminum layers. Pickering et al, discuss the effects of surface roughness on reflectance in "Characterisation of Rough Silicon Surfaces using Spectroscopic Ellipsometry, Reflectance, Scanning Electron Microscopy and Scattering Measurements," *Materials Science and Engineering*, B5, pp.295–299 (1990). In addition to lowering reflectance to a minimum at a given wavelength, the products of the annealed titanium and aluminum layers also reduce the slope of the reflectance curve to provide significantly reduced reflectance over a useful range of wavelengths as discussed in more detail below.

Figure 1:
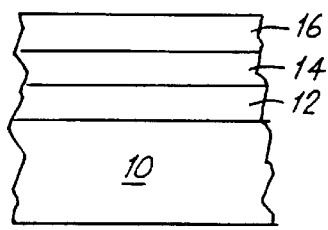
FIG. 1 is a schematic diagram of one metal stack useful in methods according to the present invention, including an uppermost layer of titanium deposited on aluminum.

FIG. 1 depicts one metal stack useful in methods according to the present invention. The metal layers are provided on a substrate 10 which can be any suitable material, e.g., silicon-based or gallium arsenide-based. The metal stack includes a first layer 12 of titanium, a layer of aluminum 14, and a top layer 16 of titanium. These layers can be deposited by any means including evaporation, sputtering, CVD, electroplating, etc.

Typically, the thickness of the metal layers 12–16 is based on electrical considerations, i.e., conductivity, etc. Typical thickness for the aluminum layer 14 is about 5000 Å, although the aluminum layer 14 can range in thickness from about 2k Å to about 12k Å depending on the needs of the circuit designer.

The thickness of the titanium layers 12 and 16 can also vary based on the need for barrier metallization to promote adhesion, as well as the need to form the desired anti-reflective coating at the exposed surface. Where the titanium layers are provided primarily to react with the aluminum to produce a desired anti-reflective coating, a preferred thickness for the titanium layers 12 and 16 can range from about 100 Å to about 1k Å, more preferably from about 200 to about 750 Å.

It is typically preferred that the layers 12–16 of the metal stack be generally free of impurities that slow or inhibit the Al—Ti reaction, e.g., silicon.

The upper layer 16 of titanium is essential to produce the desired surface roughness required to significantly decrease reflectance and the slope of the reflectance curve. The lower layer 12 of titanium can, in some instances, be eliminated, although results have shown that providing a layer 12 of titanium beneath the aluminum layer 14 can have a positive impact in reducing reflectance.

Figure 2:
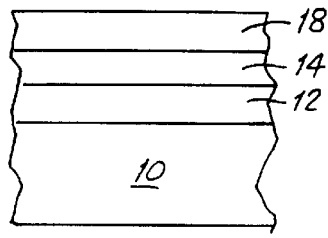
FIG. 2 is a schematic diagram of the metal stack of FIG. 1 after annealing in an inert gas environment.

After the layers 12–16 are deposited on the substrate 10 they are annealed under conditions that cause the titanium and aluminum layers to form a layer 18 having a roughened surface comprised at least partially of titanium-aluminum compounds on the metal stack as depicted in FIG. 2. To prevent undesired reactions with the exposed titanium layer 16, the chamber containing the semiconductor wafer is preferably flooded with a non-reactive atmosphere. For use in connection with the present invention, "non-reactive atmosphere" is any atmosphere that does not react with the metal layers under the annealing process conditions. One example of a non-reactive atmosphere useful in connection with the invention is argon.

In some applications, the entire upper layer 16 of titanium may react with aluminum in layer 14, but it is not required that all of the titanium in layer 16 react to produce the desired decreases in reflectivity. The amount of titanium in layer 16 that does react with the aluminum in layer 14 will depend to some extent on the thickness of the layers 14 and 16, as well as the conditions under which the annealing takes place.

The temperature used in the annealing process must be high enough to produce the required surface roughness in layer 18 required to reduce reflectance and the slope of the reflectance curve vs. wavelength to desired levels. Annealing of titanium-aluminum metal stacks on semiconductor wafers according to the present invention can be performed at temperatures within a range of about 350° to about 550° C., more preferably about 440° to about 480° C. Duration of the annealing also plays a role in formation of the desired anti-reflective coatings. It is preferred that the annealing process occur over about 30 seconds to about 15 minutes, more preferably from about two to about three minutes.

The temperature and duration of the annealing are based on a number of factors including: a) the thickness of the titanium and aluminum layers; b) formation of a sufficient amount of titanium-aluminum compounds to significantly reduce reflected light; c) the need to protect or not damage structures and materials located on the semiconductor wafer; d) the need to prevent unwanted diffusion between metal layers; and e) the need to maximize throughput in the process.

Figure 3:
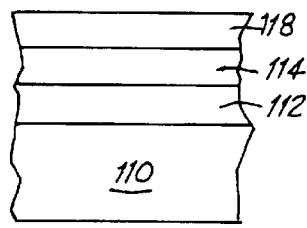
FIG. 3 is a schematic diagram of the metal stack of FIG. 1 after annealing in a nitrogen

In another method according to the present invention, the annealing step is performed while the chamber containing the semiconductor wafer is flooded with nitrogen. The nitrogen reacts with the exposed surface of the titanium layer 116 during the annealing, resulting in the formation of a layer 118 at the surface of the metal stack (including a layer 114 of aluminum deposited on a bottom layer 112 of titanium on substrate 110) as shown in FIG. 3. By providing nitrogen during the annealing, the formation of $Ti_xAl_{1-x}N_y$ and $Ti_xN_{1-x}$ (where x and y can be the same or different and, further, where x and y can be 0 to about 17, although will predominantly lie within a range from 0 to about 4) are promoted in layer 118. Other compounds may also be formed during the annealing process. The result of this process is a rough surface that reduces reflectance and the slope of the reflectance versus wavelength curve.

Typical wavelengths used to image photoresist materials in optical lithography processes range from about 100 nm to about 450 nm, with the exact wavelength or range of wavelengths being chosen based on a number of factors including the composition of the photoresist, pattern dimensions, resolution, etc. Some wavelengths that are particularly useful include 254 mn and 365 nm.

By depositing a layer of titanium over aluminum and annealing the layers, the present invention provides a method of reducing the amount of light reflected off of a layer of exposed aluminum on a semiconductor wafer from near 100% to at or below about 10% over the range of useful optical lithography wavelengths, i.e., 100–450 nm, when measured using spectral analysis techniques. If the titanium-aluminum layers are annealed in a nitrogen atmosphere, even further reductions in reflectance can be obtained, i.e., down to at or below about 2% over the 100–450 nm range.

As an alternative to the processes described above, it is also possible to perform the annealing in multiple phases, i.e., annealing in an inert gas atmosphere followed by annealing in nitrogen or vice versa.

The following non-limiting examples illustrate some methods of annealing titanium and aluminum on the surface of a semiconductor wafers.

EXAMPLE 1

In one method according to the present invention, a 500 Å thick layer of titanium was deposited on a generally planar boronphosphosilicate glass substrate using direct current magnetron sputtering. A 5000 Å thick layer of aluminum was deposited on the titanium layer using direct current magnetron sputtering in the same tool, after which a second layer of titanium having a thickness of about 500 Å was then deposited over the aluminum layer using direct current magnetron sputtering in the same chamber used to deposit the first titanium layer. All layers were substantially homogenous in composition.

The wafer was then placed in an annealing chamber and annealed at 480° C. for a period of three minutes. The chamber was flooded with argon at 3 Torr during annealing to prevent the exposed titanium layer from reacting with other materials.

Figure 4:
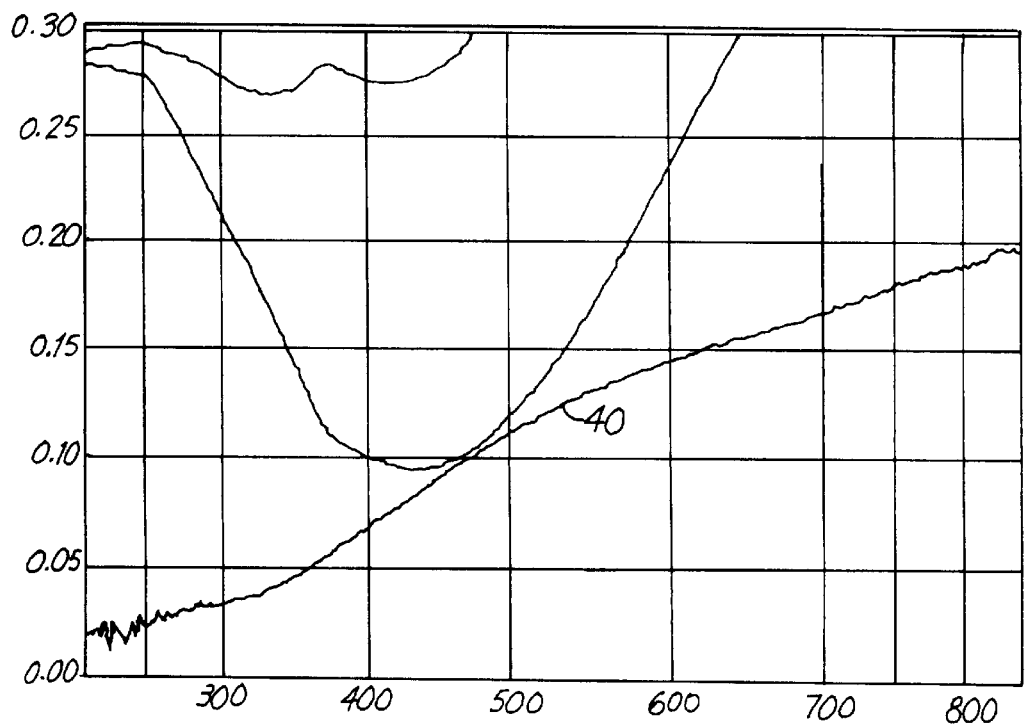
FIG. 4 is graph of reflectance of an annealed metal stack produced according to Example 1.

The reflectance curve of the exposed annealed metal stack, as measured with a spectral analyzer (Model UV1050, Tencor, Boise, Id.) according to the procedures discussed above, is depicted in FIG. 4. Line 40 shows that the reflectance of the stack is at or below 10% over the 100–450 nm wavelength range.

EXAMPLE 2

In another method according to the present invention, a 300 Å thick layer of titanium was deposited on a generally planar boronphosphosilicate glass substrate using direct current magnetron sputtering. A 5000 Å thick layer of aluminum was deposited on the titanium layer using direct current magnetron sputtering in the same tool, after which a second layer of titanium having a thickness of about 500 Å was then deposited over the aluminum layer using direct current magnetron sputtering in the same chamber used to deposit the first titanium layer. All layers were substantially homogenous in composition.

The wafer was then placed in an annealing chamber and annealed at 480° C. for a period of three minutes. The chamber was flooded with argon at 3 Torr during annealing to prevent the exposed titanium layer from reacting with other materials.

Figure 5:
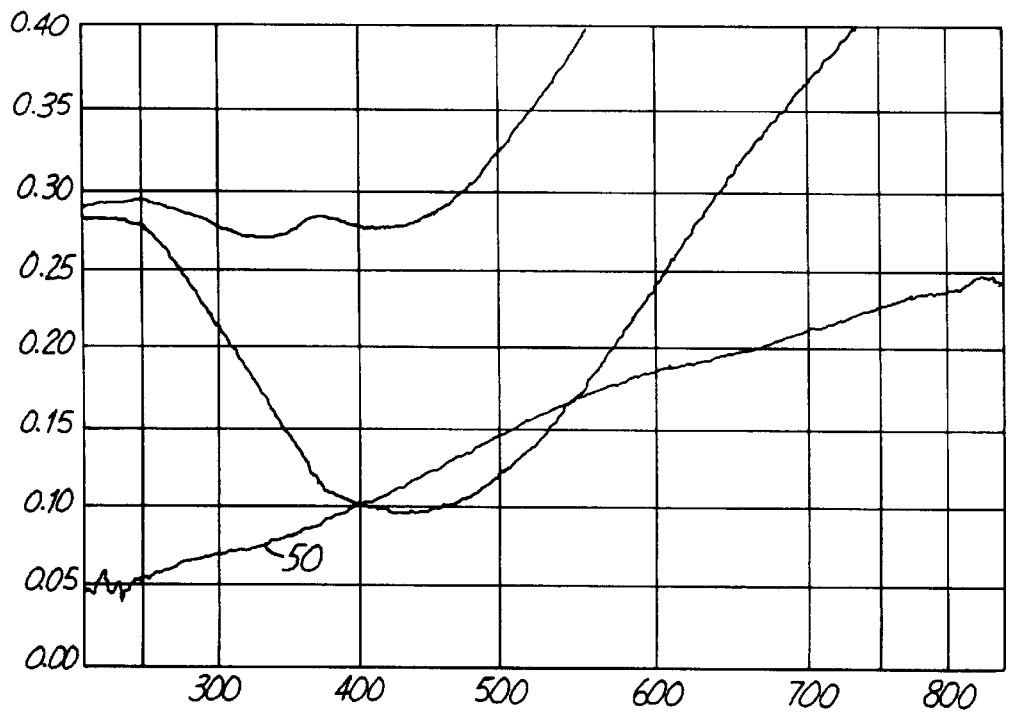
FIG. 5 is a graph of reflectance of an annealed metal stack produced according to Example 2.

The reflectance curve of the exposed annealed metal stack, as measured according to the procedures discussed above, is depicted in FIG. 5. Line 50 shows that the reflectance of the stack is at or below about 12% over the 100–450 nm wavelength range.

EXAMPLE 3

In another method according to the present invention, a 500 Å thick layer of titanium was deposited on a generally planar boronphosphosilicate glass substrate using direct current magnetron sputtering. A 5000 Å thick layer of aluminum was deposited on the titanium layer using direct current magnetron sputtering in the same tool, after which a second layer of titanium having a thickness of about 500 Å was then deposited over the aluminum layer using direct current magnetron sputtering in the same chamber used to deposit the first titanium layer. All layers were substantially homogenous in composition.

The wafer was then placed in an annealing chamber and annealed at 480° C. for a period of two minutes. The chamber was flooded with nitrogen at 3 Torr during annealing to promote the formation of $Ti_xAl_{1-x}N_y$ and $Ti_xN_{1-x}$ in the metal stack.

Figure 6:
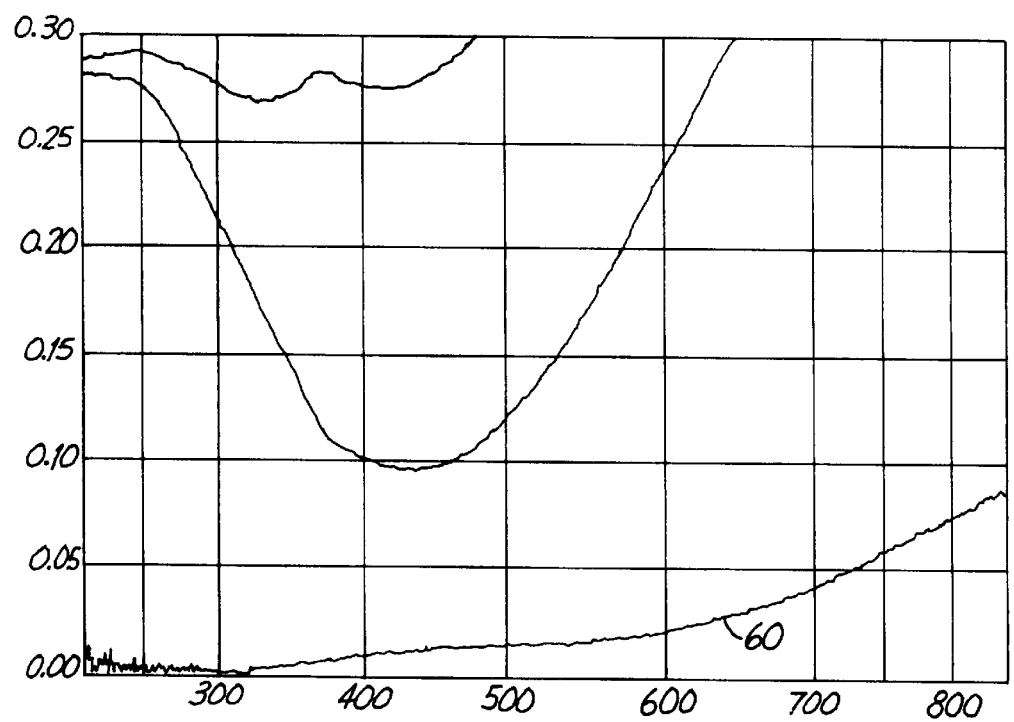
FIG. 6 is a graph of reflectance of an annealed metal stack produced according Example 3.

The reflectance curve of the exposed-annealed metal stack, as measured according to the procedures discussed above, is depicted in FIG. 6. Line 60 shows that the reflectance of the stack is at or below about 2% over the 100–450 nm wavelength range.

EXAMPLE 4

In another method according to the present invention, a 500 Å thick layer of titanium was deposited on a generally planar boronphosphosilicate glass substrate using direct current magnetron sputtering. A 5000 Å thick layer of aluminum was deposited on the titanium layer using direct current magnetron sputtering in the same tool, after which a second layer of titanium having a thickness of about 500 Å was then deposited over the aluminum layer using direct current magnetron sputtering in the same chamber used to deposit the first titanium layer. All layers were substantially homogenous in composition.

The wafer was then placed in an annealing chamber and annealed at 480° C. for a period of three minutes. The chamber was flooded with nitrogen at 3 Torr during annealing to promote the formation of $Ti_xAl_{1-x}N_y$ and $Ti_xN_{1-x}$ in the metal stack.

Figure 7:
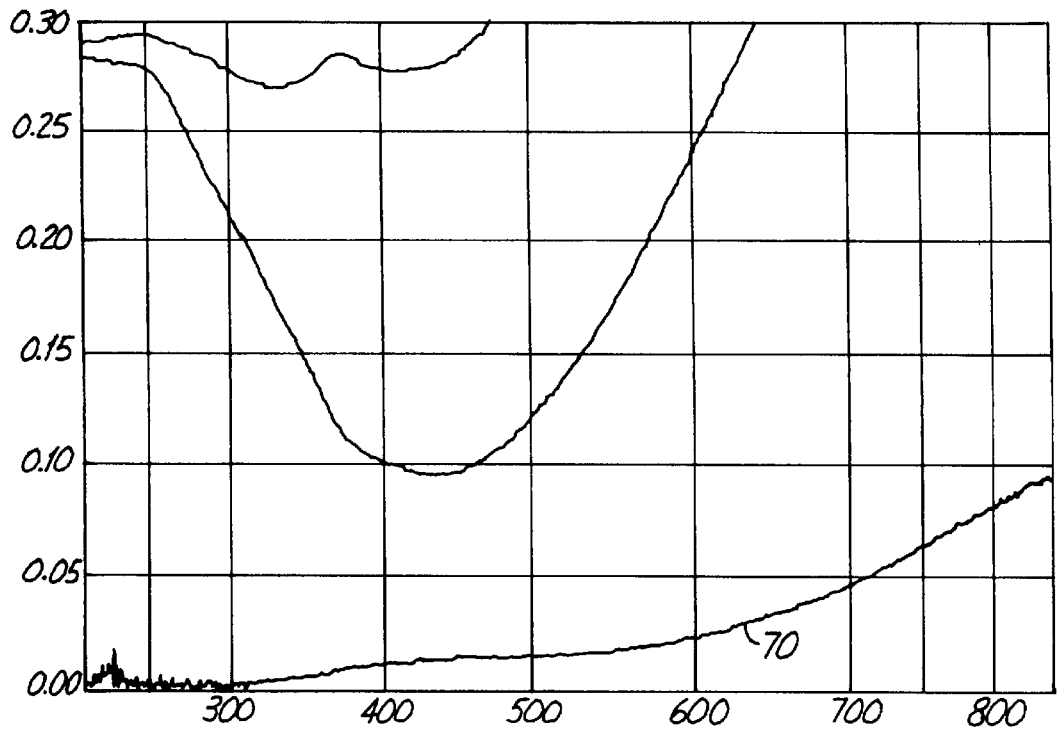
FIG. 7 is a graph of reflectance of an annealed metal stack produced according to Example 4.

The reflectance curve of the exposed annealed metal stack, as measured according to the procedures discussed above, is depicted in FIG. 7. Line 70 shows that the reflectance of the stack is at or below about 2% over the 100–450 nm wavelength range.

Comparative Example A

A layer of TiN having a thickness of about 250 Å was sputtered over a layer of aluminum having a thickness of about 5000 Å to provide an anti-reflective coating.

Figure 8:
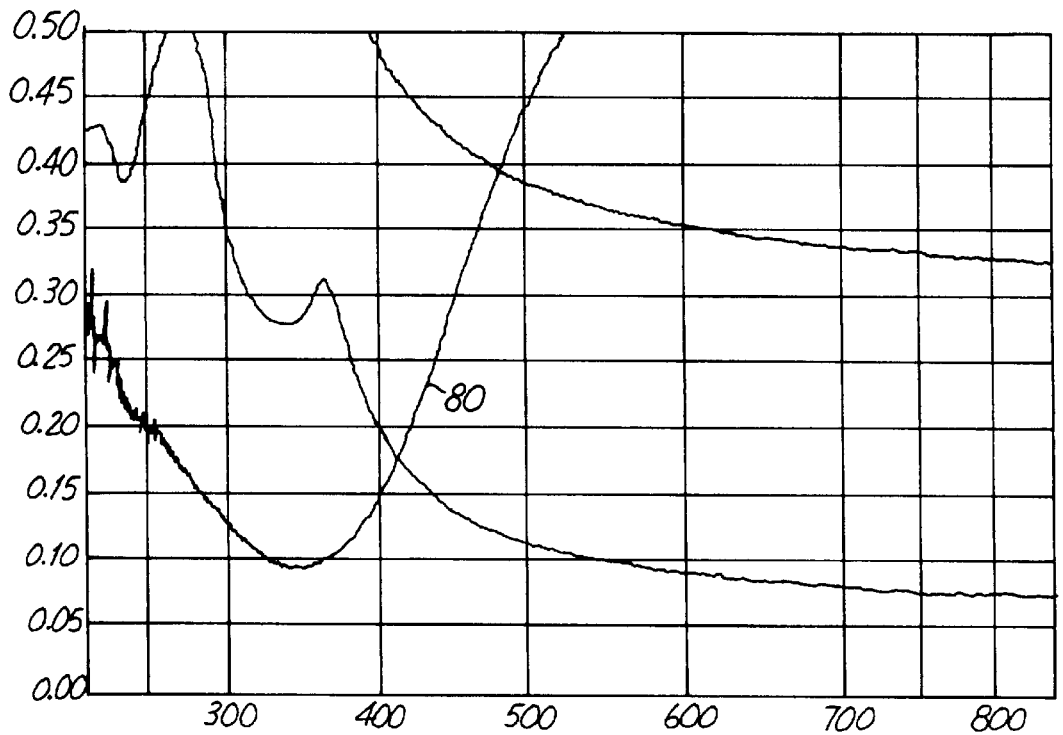
FIG. 8 is a graph of reflectance of a layer of TiN produced according to Comparative Example A.

The reflectance of the exposed TiN layer was measured according to the procedures discussed above and the results depicted in FIG. 8. Line 80 shows that the reflectance of the TiN layer to reach a minimum of about 9% at a wavelength of about 350 nm. Reflectance rises rapidly, however, on either side of the minimum as compared to the relatively low reflectance obtained over the range of about 100 to about 450 nm by annealing titanium and aluminum according to the present invention.

Although specific methods and examples have been illustrated and described herein, it will be appreciated by those of ordinary skill in the art that any arrangement that is calculated to achieve the same purpose may be substituted for the specific methods and examples described. This application is intended to cover any adaptations or variations of the present invention. Therefore, it is manifestly intended that this invention be limited only by the claims and the equivalents thereof.

What is claimed is:

1. A semiconductor device comprising:
   a) a layer of aluminum located above a substrate;
   b) an anti-reflective layer above the aluminum layer, the anti-reflective layer comprising one or more titanium compounds selected from the group consisting of $Ti_xAl_{1-x}$ and $Ti_xAl_{1-x}N_y$ where x and y can be the same or different.

2. A semiconductor device according to claim 1, further comprising a layer of titanium between the layer of aluminum and the substrate.

3. A semiconductor device comprising:
   a) a layer of titanium;
   b) a layer of aluminum located above the layer of titanium; and
   c) an anti-reflective layer above the aluminum layer, the anti-reflective layer comprising one or more titanium compounds selected from the group consisting of $Ti_xAl_{1-x}$ and $Ti_xAl_{1-x}N_y$ where x and y can be the same or different, and, wherein the anti-reflective layer reflects about 10% or less of light in the wavelength range of about 100 to about 450 nm.

4. A semiconductor device according to claim 3, wherein the anti-reflective layer reflects about 5% or less of light in the wavelength range of about 100 to about 450 nm.

5. A semiconductor device according to claim 3, wherein the anti-reflective layer reflects about 2% or less of light in the wavelength range of about 100 to about 450 nm.

6. A semiconductor device comprising:
   a) a layer of aluminum located above a substrate;
   b) an anti-reflective layer above the aluminum layer, the anti-reflective layer comprising one or more titanium compounds selected from the group consisting of $Ti_xAl_{1-x}$ and $Ti_xAl_{1-x}N_y$, where x and y can be the same or different, wherein the anti-reflective layer reflects about 10% or less of light in the wavelength range of about 100 to about 450 nm.

7. A semiconductor device comprising:
a) a layer of aluminum located above a substrate;
b) an anti-reflective layer above the aluminum layer, the anti-reflective layer comprising one or more titanium compounds selected from the group consisting of $Ti_xAl_{1-x}$ and $Ti_xAl_{1-x}N_y$, where x and y can be the same or different, wherein the anti-reflective layer reflects about 5% or less of light in the wavelength range of about 100 to about 450 nm.

8. A semiconductor device comprising:
a) a layer of aluminum located above a substrate;
b) an anti-reflective layer above the aluminum layer, the anti-reflective layer comprising one or more titanium compounds selected from the group consisting of $Ti_xAl_{1-x}$ and $Ti_xAl_{1-x}N_y$, where x and y can be the same or different, wherein the anti-reflective layer reflects about 2% or less of light in the wavelength range of about 100 to about 450 nm.

* * * * *